(12) United States Patent
Rusch et al.

(10) Patent No.: US 11,664,562 B2
(45) Date of Patent: May 30, 2023

(54) REDIRECTING DEVICE FOR MM-WAVES, CONNECTION ASSEMBLY

(71) Applicant: TE Connectivity Germany GmbH, Bensheim (DE)

(72) Inventors: Christian Rusch, Bensheim (DE); Bert Bergner, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 17/005,717

(22) Filed: Aug. 28, 2020

(65) Prior Publication Data

US 2021/0066776 A1    Mar. 4, 2021

(30) Foreign Application Priority Data

Aug. 30, 2019  (EP) ..................... 19194690

(51) Int. Cl.
| | |
|---|---|
| *H01P 1/02* | (2006.01) |
| *H01P 3/16* | (2006.01) |
| *H01P 5/08* | (2006.01) |
| *H05K 1/02* | (2006.01) |
| *H01P 1/04* | (2006.01) |

(52) U.S. Cl.
CPC .............. *H01P 1/022* (2013.01); *H01P 1/042* (2013.01); *H01P 3/16* (2013.01); *H01P 5/087* (2013.01); *H05K 1/0243* (2013.01)

(58) Field of Classification Search
CPC .......... H01P 1/022; H01P 1/025; H01P 1/027; H01P 1/042
USPC .................................................. 333/249, 254
See application file for complete search history.

(56) References Cited

U.S. PATENT DOCUMENTS

| | | | |
|---|---|---|---|
| 2014/0285277 A1 | 9/2014 | Herbsommer | |
| 2014/0285291 A1* | 9/2014 | Payne et al. ............ | H01P 5/087 333/239 |
| 2017/0170539 A1 | 6/2017 | Morgan | |
| 2018/0097269 A1* | 4/2018 | Dogiamis et al. ...... | G06F 1/182 |
| 2018/0198184 A1* | 7/2018 | Onishi ...................... | H01P 3/16 |

FOREIGN PATENT DOCUMENTS

| | | |
|---|---|---|
| EP | 0767507 A1 | 4/1997 |
| EP | 3462533 A1 | 4/2019 |
| WO | 2014099389 A1 | 6/2014 |

OTHER PUBLICATIONS

Extended European Search Report, dated Feb. 24, 2020, 8 pages.

* cited by examiner

*Primary Examiner* — Benny T Lee
(74) *Attorney, Agent, or Firm* — Barley Snyder (57) ABSTRACT

A redirecting device for mm-waves includes an input section, an output section disposed at 90 degrees to the input section, and a waveguide member extending from the input section to the output section. The waveguide member is a rigid dielectric material.

17 Claims, 10 Drawing Sheets

REDIRECTING DEVICE FOR MM-WAVES, CONNECTION ASSEMBLY

CROSS-REFERENCE TO RELATED APPLICATION

This application claims the benefit of the filing date under 35 U.S.C. § 119(a)-(d) of European Patent Application No. 19194690, filed on Aug. 30, 2019.

FIELD OF THE INVENTION

The present invention relates to redirecting electromagnetic waves and, more particularly, redirecting mm-waves having a wavelength of 1 to 10 mm.

BACKGROUND

Electromagnetic waves having a wavelength of 1 to 10 mm, also referred to as mm-waves, are, for example, used in mobile communication (5G) or for radar signal transmission. For the transmission of such electromagnetic waves, flexible elements can be used. When such flexible elements are connected to other elements, for example a PCB, the assembly is very bulky.

SUMMARY

A redirecting device for mm-waves includes an input section, an output section disposed at 90 degrees to the input section, and a waveguide member extending from the input section to the output section. The waveguide member is a rigid dielectric material.

BRIEF DESCRIPTION OF THE DRAWINGS

The invention will now be described by way of example with reference to the accompanying Figures, of which.

DETAILED DESCRIPTION OF THE EMBODIMENT(S)

The invention will now be described in greater detail and in an exemplary manner using embodiments and with reference to the drawings, where like features are denoted by the same reference labels throughout the description of the drawings. The described embodiments are only possible configurations in which, however, the individual features as described herein can be provided independently of one another or can be omitted.

A redirecting device 100 according to various embodiments is shown in FIGS. 1-7.

Figure 1:
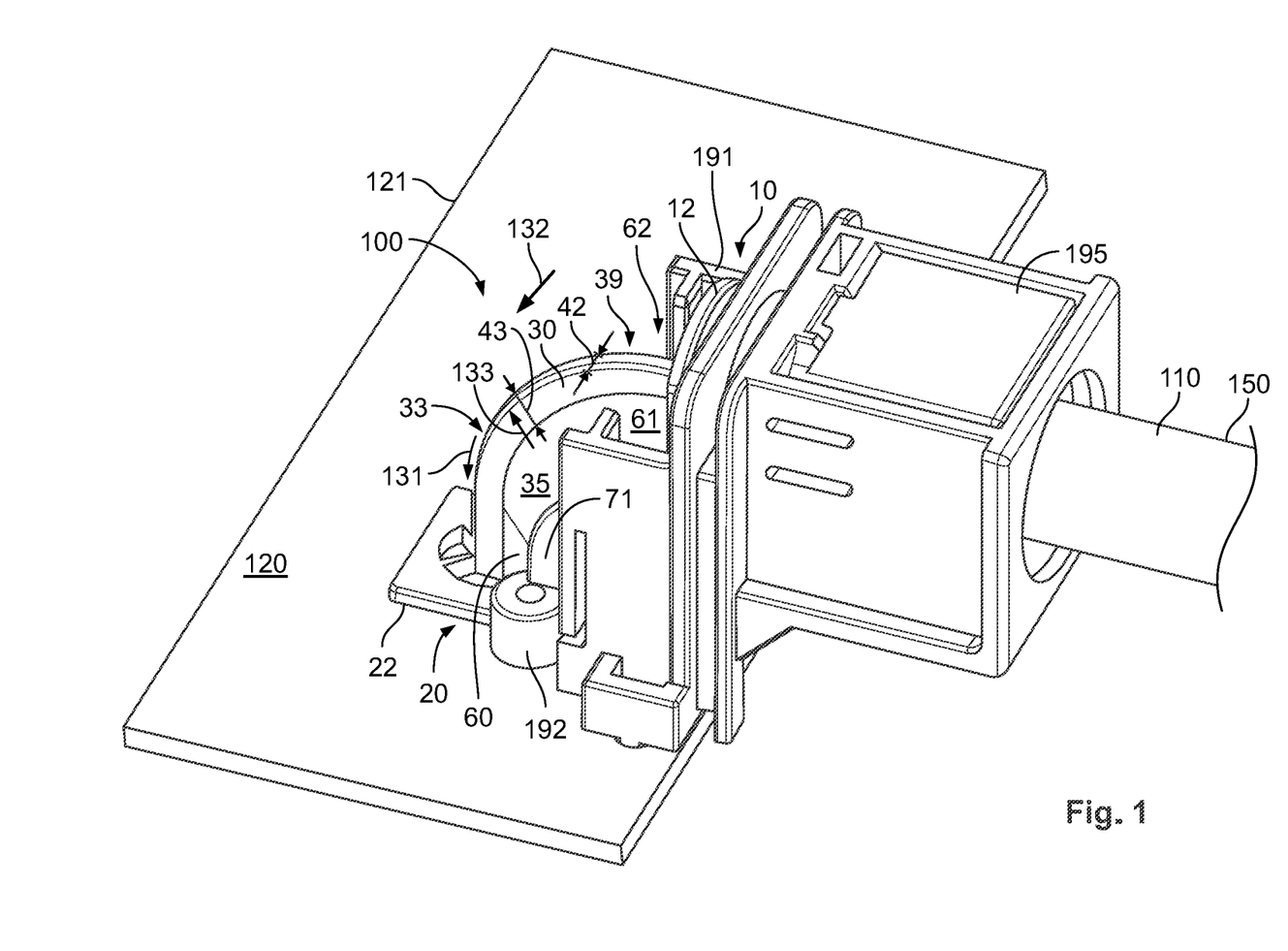
FIG. 1 is a perspective view of a redirecting device according to an embodiment in a mounted state.
Figure 4:
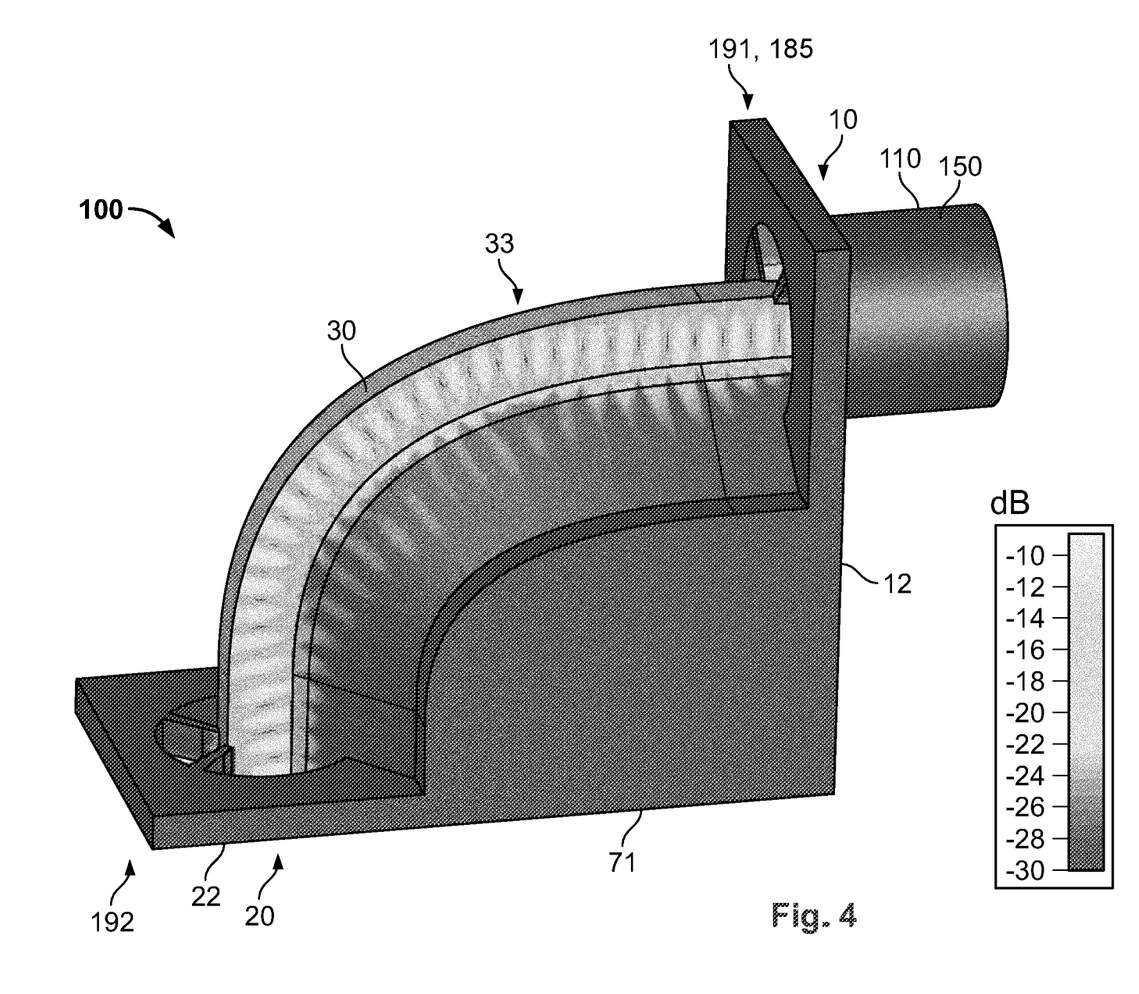
FIG. 4 is a schematic perspective view of a calculation of an electric field distribution in the redirecting device of FIG. 2.

In FIG. 1, a first embodiment of a redirecting device 100 is shown together with further components. The redirecting device 100 comprises an input section 10 for connecting to a first external element 110 (FIG. 4), which in this case is a waveguide 150 (FIG. 4). Electromagnetic waves of certain frequencies can pass through the waveguide 150 and be directed to a second external element 120 located at output section 20 at an opposite side of the redirecting device 100. The second external element 120 is a PCB 121 in the depicted example.

For fixing the first external element 110 to the redirecting device 100, a plug 195 can be used, as shown in FIG. 1. For a good connection, the redirecting device 100 can comprise a first fixing element 191. The redirecting device 100 further comprises a second fixing element 192 for connecting to the second external member 120. This second fixing element 192 can, for example, comprise a through-hole through which a bolt or similar element can be inserted.

The redirecting device 100 further comprises a rigid, dielectric waveguide member 30 extending from the input section 10 to the output section 20, as shown in FIG. 1. The waveguide member 30 serves to guide the electromagnetic waves from the waveguide 150 to the element on the PCB 121 or from the element on the PCB 121 to the waveguide 150. For example, mobile communication signals can be created on the element on the PCB 121 and then be directed to a distribution element. The PCB 121 may have wave-emitting elements like an antenna.

The input section 10 and the output section 20 are at 90 degrees to each other in the embodiment shown in FIG. 1. This results in a space saving configuration, as the waveguide 150 can be parallel to the PCB 121. With this solution, flexible elements no longer have to be attached perpendicular to the other element, for example the PCB 121, but can rather be installed such that the flexible elements run parallel to it. Such an arrangement is thus more space saving.

To stabilize the configuration, the input section 10 and output section 20 are mechanically connected to each other. The waveguide member 30 has a low or no elastic and plastic deformability to improve the transmission performance. The waveguide member 30 can be a solid element. In contrast to a hollow element, such a solid element can be easier to produce.

Figure 2:
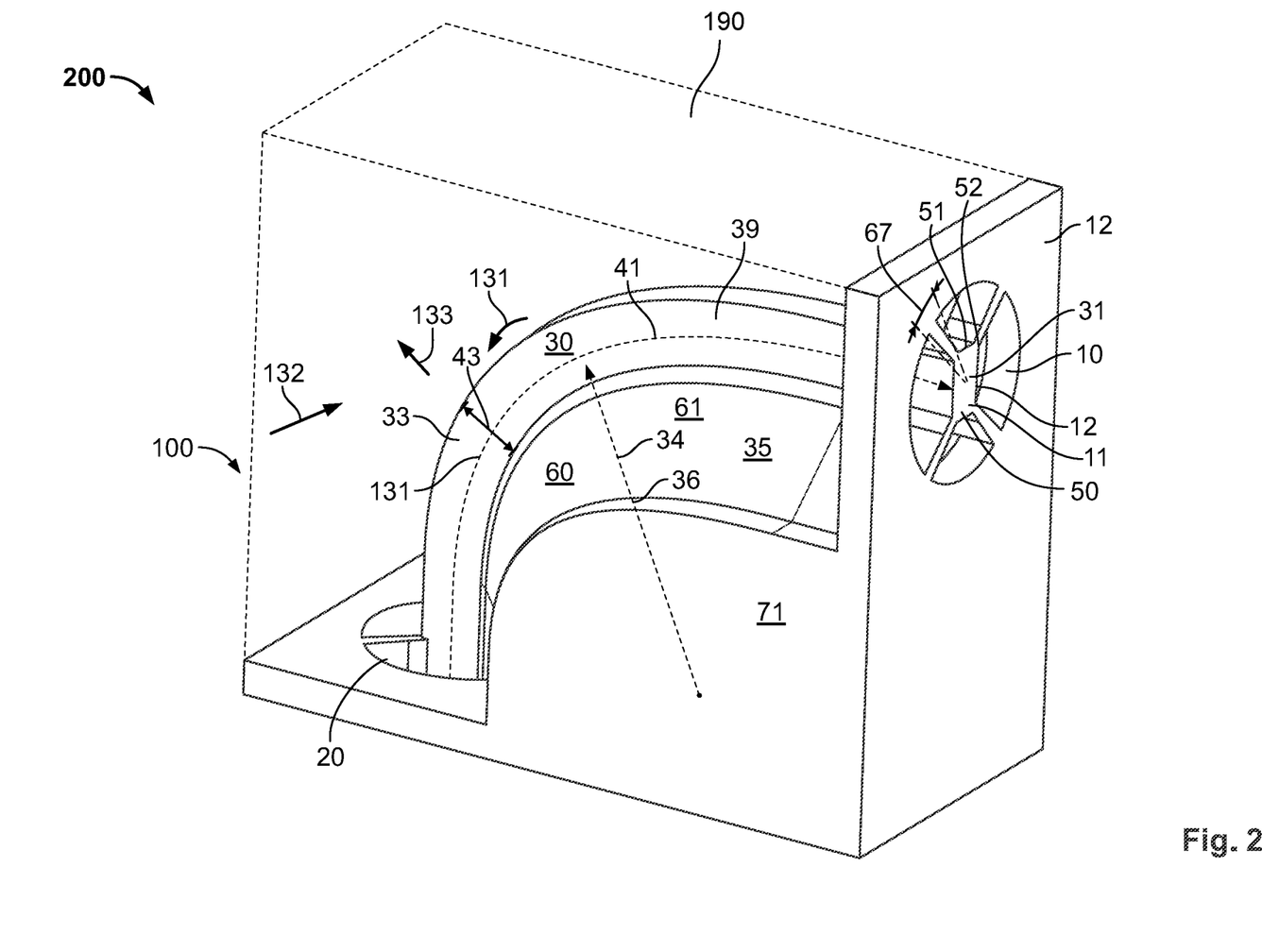
FIG. 2 is a perspective view of the redirecting device.

The waveguide member 30 is an elongated element 39 (FIG. 2). A length 41 (FIG. 2) of the waveguide member 30 in a length direction 131 (FIGS. 2,3) that goes along a curve from the input section 10 to the output section 20 is greater by a factor of at least 5 than a width 42 in a width direction 132 (FIG. 2) and a height 43 in a height direction 133. The length direction 131, the width direction 132 and the height direction 133 are each perpendicular to each other at a certain point of the waveguide member 30. The absolute orientations of these directions, however, changes along the extension of the waveguide member 30.

As shown in FIG. 1, the waveguide member 30 runs along a 90 degree curve 33 (FIG. 4). In an embodiment, the curve 33 could have a constant radius. However, the curvature radius 34 shown in FIG. 2 can vary along the waveguide member 30. A minimum curvature radius 36 should not be below a certain limit in order to be able to appropriately transmit the mm-waves, which have wavelengths of approximately 1 to 10 mm in vacuum. The minimum curvature radius 36 is greater than one wavelength in an embodiment.

Figure 3:
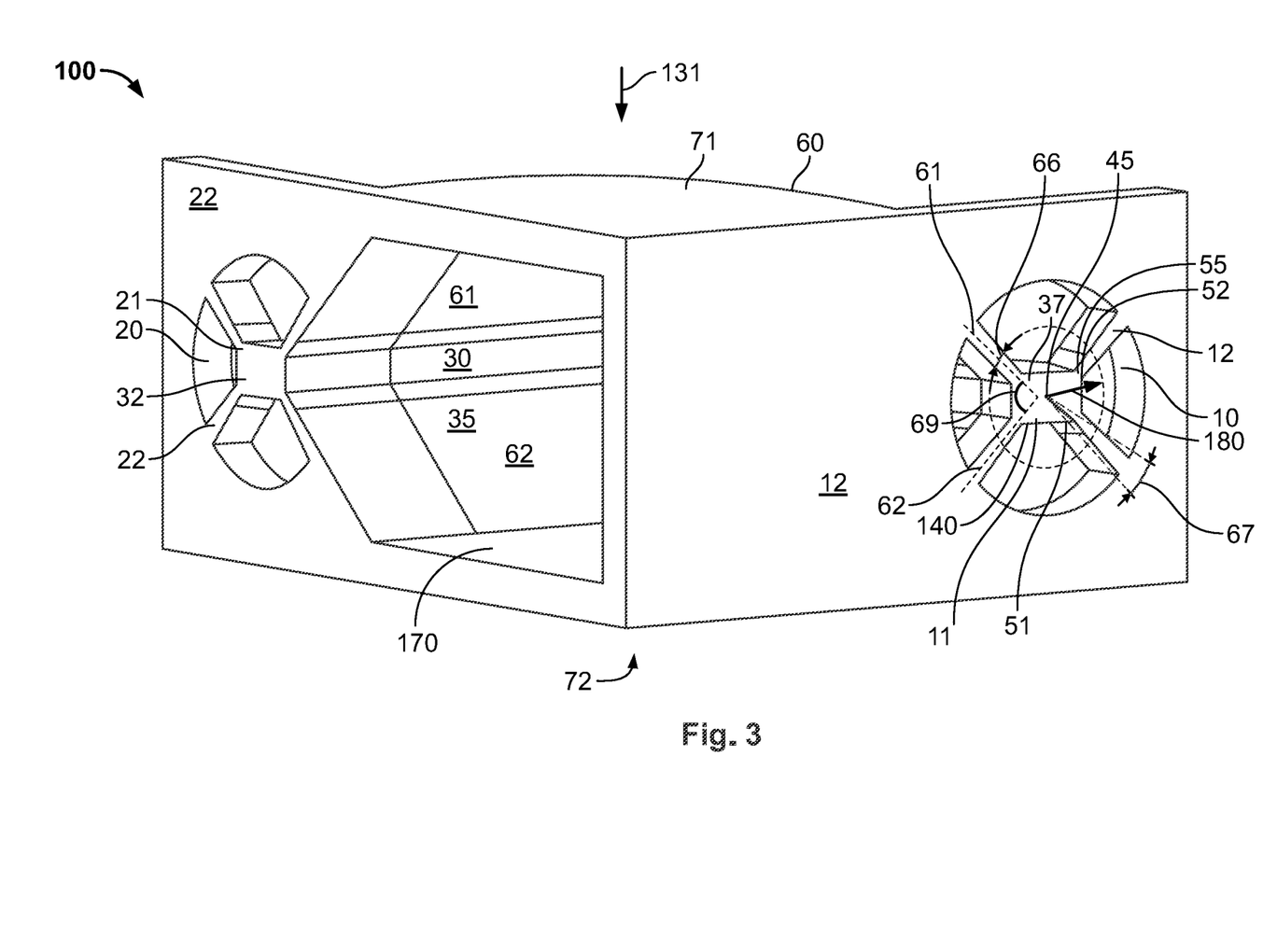
FIG. 3 is another perspective view of the redirecting device of FIG. 2.

The redirecting device 100 comprises a support structure 60 shown in FIG. 1 and FIG. 3 for supporting the waveguide member 30. The support structure 60 extends along the waveguide member 30 from the input section 10 to the output section 20. In the depicted example, the support structure 60 extends continuously or uninterruptedly from the input section 10 to the output section 20. However, in an embodiment that is more lightweight, holes or recesses could be present in the material. The support structure 60 can comprise webs, struts and/or sheet-like sections. The support structure 60 can comprise or contain basically flat sections to keep the weight low. The support structure 60 is arranged at an inner side 35 of the curve 33 of the waveguide member 30, in order to save space.

In FIGS. 2 and 3, further details of an embodiment of the redirecting device 100 can be seen.

The input section 10 and the output section 20 comprise planar end surfaces 31 (FIG. 2), 32 (FIG. 3) of the waveguide member 30, as shown in FIGS. 2 and 3, which constitute a first coupling face 11 (FIG. 3) for coupling to the first external member 110 (FIG. 1) and a second coupling face 21 for coupling to the second external member 120 (FIG. 1). The waveguide member 30 extends away in a perpendicular manner from the first coupling face 11 and the second coupling face 21. The first coupling face 7 and the second coupling face 21 are 90 degrees to each other. The first coupling face 7 and the second coupling face 21 are configured to be in direct contact with further external elements, like the waveguide 150 and the element on the PCB 121 as shown in FIG. 1.

The waveguide member 30 has a constant cross-section 50, shown in FIG. 2, from the input section 10 to the output section 20, as shown in FIG. 1. Thus, the cross-section 50 of the input section 10 and the output section 20 are similar, in particular identical, to the cross-section 50 of the waveguide member 30. In the embodiment shown in FIGS. 2 and 3, the cross section 50 is of a rectangular 51 shape, forming a rectangular cross-section 140 (FIG. 3). In other embodiments, the cross section 50 can have other shapes and, for example, be circular or elliptical. In order to achieve a good transmission, a dimension of the cross-section 50 should be within a certain range defined by the waves used with the redirecting device 100 (FIG. 3). Further, the cross-section 50 can be adapted to the waveguide 150 (FIG. 1), in particular to the cross-section of the core of the waveguide 150. In order to be adapted for the transmission of mm-waves, a dimension of the cross-section 50 can be greater than 0.2 times the wavelength and/or less than 1.5 times the wavelength.

In order to minimize losses, fixation points 55 shown in FIG. 3, at which the support structure 60 (FIG. 2) is attached to the waveguide member 30, are located at corners 52 of the rectangular cross-section 140.

The input section 10 defines a first mounting plane 12 (see also FIGS. 1 and 4) and the output section 20 defines a second mounting plane 22 (see also FIGS. 1, 3 and 4). The first coupling face 11 and the second coupling face 21 are flush with the first mounting plane 12 or the second mounting plane 22, respectively.

As shown in FIGS. 2 and 3, the support structure 60 extends from the waveguide member 30 to the first mounting plane 12 and the second mounting plane 22. The first mounting plane 12 is perpendicular to the second mounting plane 22. The support structure 60 encloses an air volume or an air cladding 170 (FIG. 3). The fact that no material is present in this area results in a good transmission of the waves. In the depicted example, the air cladding 170 extends to the second mounting plane 22. In further embodiments, the air cladding 170 can also extend to the first mounting plane 12.

Figure 6:
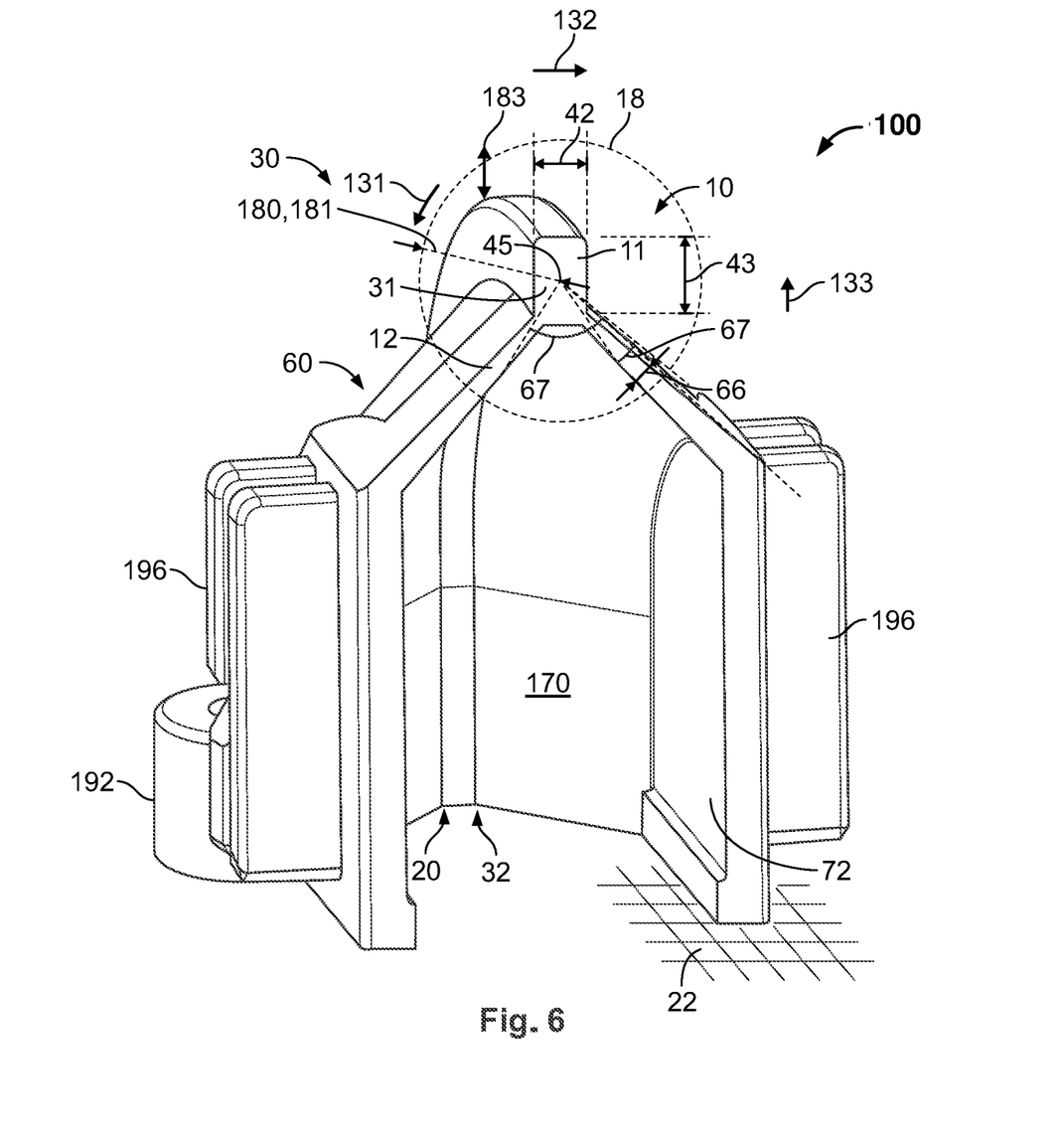
FIG. 6 is a perspective view of a redirecting device according to another embodiment.

To avoid outcoupling of signals, and thus improve the signal, apart from the input section 10, the output section 20, and the support structure 60, no further material is present next to the waveguide member 30 (that means within a certain distance 183 from the waveguide member 30 as shown in FIG. 6). The expression "next to" can be understood as within 0.5 times the wavelength and/or a maximum width of waveguide member 30; the distance 183 can be dependent on the wavelength that is used. In alternative embodiments, a material with a low permittivity, e.g. foam, can be present next to the waveguide member 30 for achieving a similar effect. Such a material with a low permittivity can act as a spacer, ensuring that no material or elements with high permittivity can come close to the waveguide member 30 and disturb the transmission performance.

The support structure 60 comprises two parts 61, 62 extending away from the waveguide member 30 and extending away from each other at an angle 69, as shown in FIGS. 1, 2 and 3. The angle 69 can be, for example 90 degrees or 60 degrees. A first part 61 is connected to a first wall section 71 (FIGS. 1 and 4) and a second part 62 is connected to a second wall section 22. The first wall section 71 and the second wall section 72 run parallel to each other.

As can, for example, be seen in FIG. 3, in a cross-section, the thickness 66 of the part 61 of the support structure 60 extending away from the waveguide member 30 is less than 20% of a maximum thickness 37 of the waveguide member 30. The maximum thickness 37 can, in this example, be the height 43 of the waveguide member 30 measured in a height direction 133. The maximum thickness could also be the width 42 or a radius. The thickness 66 can be measured at a distance 180 away from a center of the waveguide member 30. It could also be measured from the outer surface of the waveguide member 30. The distance 180 can, for example, be defined by multiples of the wavelength. The thickness 66 can also be the thickness of the part 61, 62 directly next to the waveguide member 30. The thickness 66 of the first part 61 is measured in a circumferential direction. The thickness 66 of the first part 61 is also similar to the thickness of the second part 62 of the support structure 60 and to the thickness of further support elements present at the input section 10 or the output section 20. Each of the parts 61, 62 of the support structure 60 tapers towards the waveguide member 30, which means that the thickness 66 decreases towards the waveguide member 30. The support structure 60 is arranged at an inner side 35 of the curve 33 of the waveguide member 30.

The redirecting device 100 is a single monolithic piece. In an embodiment the redirecting device 100 includes only plastic, no metal, not even as a coating. This can simplify the production. Embodiments of the redirecting device 100 can be configured to be moldable with a two-piece die. For example, a demolding direction can exist along which no undercuts are present. The redirecting device 100 can be a monolithically molded piece.

The first fixation element 191 is formed by a board member 185 of the redirecting device 100, as shown in FIG. 4. The board member 185 is a planar sheet like section of the redirecting device 100 that is in the present case located next to the input section 10. A further board member 185 can be present at the output section 20. The board member 185 can serve to cover or close off attached external elements to avoid damages. The board member 185 extends away from the input section 10 sideways.

A connection assembly 200 (FIG. 2) comprises the redirecting device 100 and can further comprise a housing element 190 (as shown in FIGS. 2, 3 and 4), wherein the housing element 190 is spaced a certain distance away from the waveguide member 30. The housing element 190 may be spaced at least 1.0 times the wavelength away from the waveguide member 30 at any point. The housing element 190 is, for example, shown schematically only in broken lines in FIG. 2. In an embodiment, the housing element 190 is integral with the redirecting device 100 in a single monolithic part.

In FIG. 4, a visualization of a calculated distribution of the electric field in an embodiment of a redirecting device 100 is shown in reference to the illustrated field strength scale. It can be seen that only a small fraction of the field is present outside the waveguide member 30 so that the losses are low. Further, a second fixing element 192 (FIG. 1) is similar to a first fixing element 191.

Figure 5:
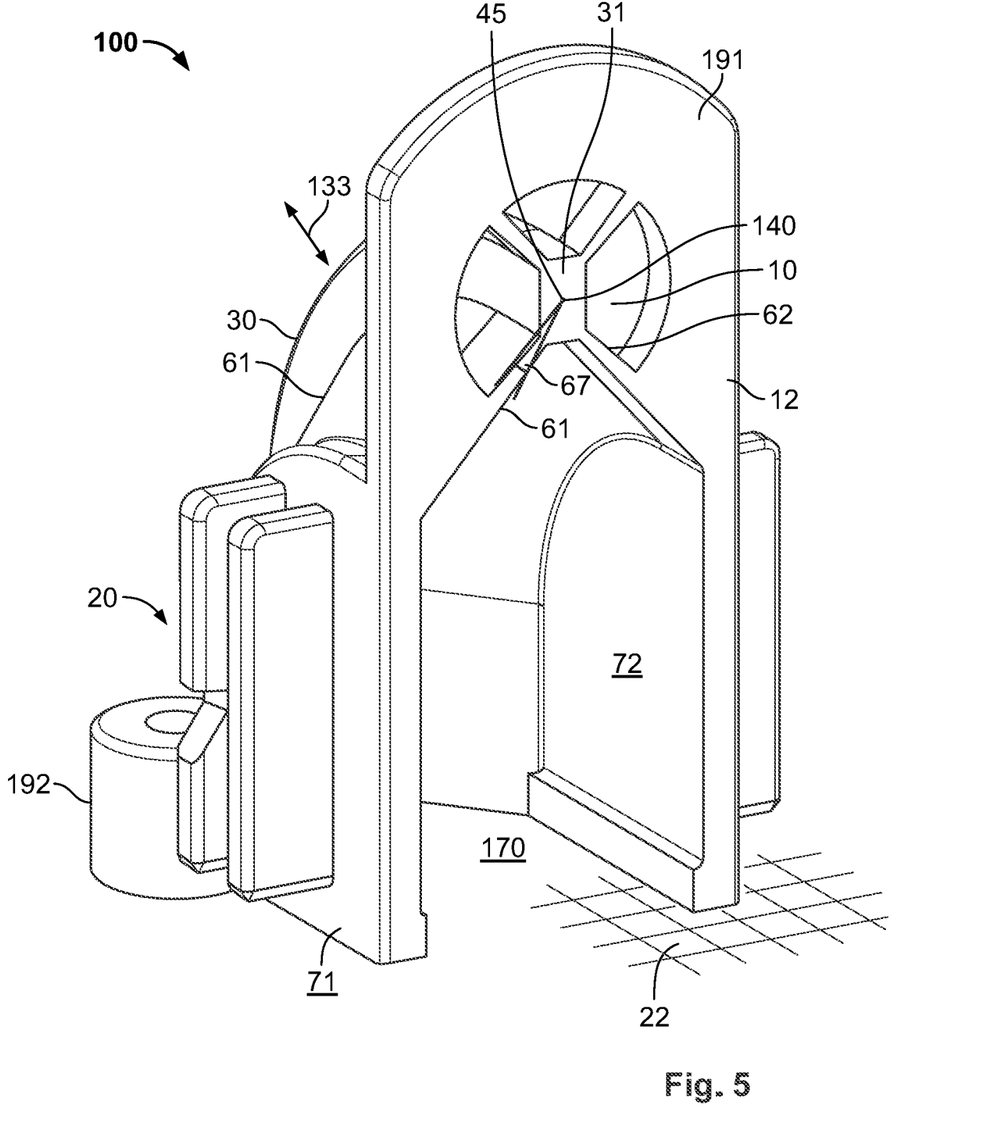
FIG. 5 is a perspective view of a redirecting device according to another embodiment.
Figure 7:
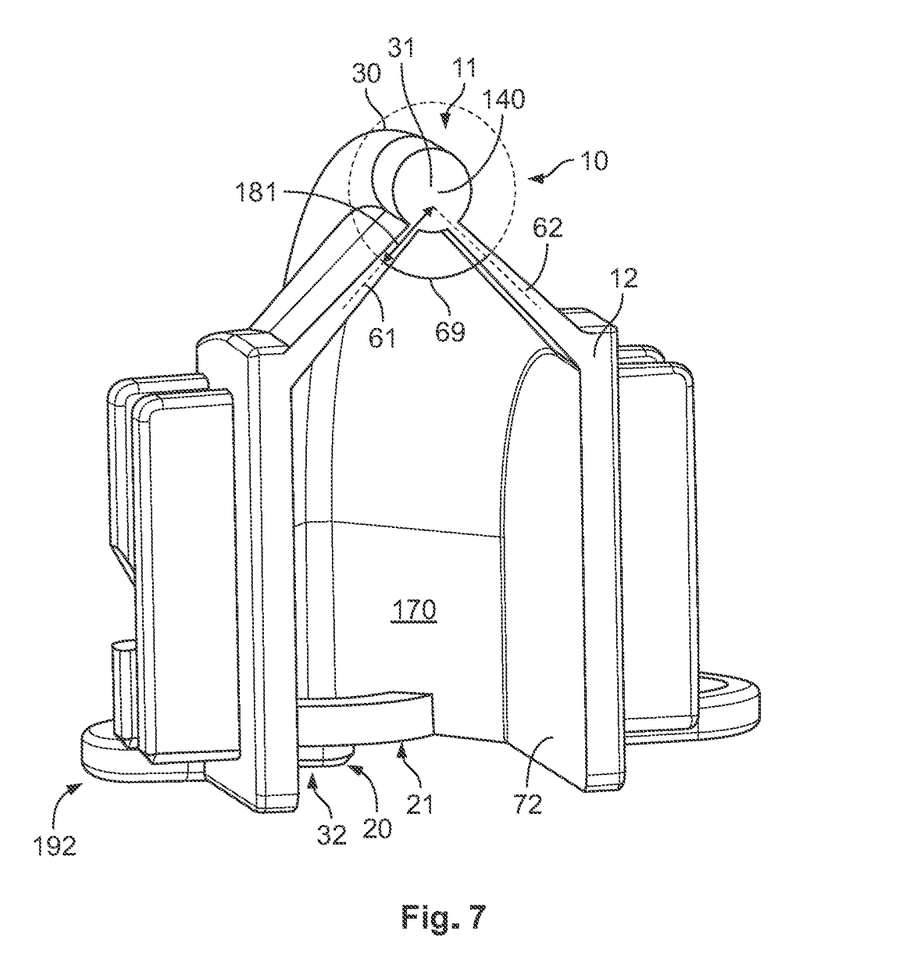
FIG. 7 is a perspective view of a redirecting device according to another embodiment.

Several embodiments of a redirecting device 100 are shown in FIGS. 5-7.

The embodiment shown in FIG. 5 is similar to the one in FIG. 1 and comprises a rectangular cross-section 140 of the waveguide member 30. It further comprises a fixing element 191 next to the input section 10 for fixing the redirecting device 100 to the first external element 110 (FIG. 1). The first fixing section 191 comprises a plate-shaped structure that can provide stop faces for a positive fit with corresponding elements on the external element 10 or a plug 195 (FIG. 1) attached to the external element 110. A description of the remaining features common to the previously described embodiments has been omitted herein for the purposes of brevity.

In the embodiment shown in FIG. 6, no such plate-shaped structure is present. Fixing can, for example, be achieved by further fixing elements 196 present at the sides of the redirecting device 100. This embodiment also has a rectangular cross-section. It can further be seen that at a distance 181 away from the center of the waveguide member 30, the parts 61 and 62 (FIG. 7) of the support structure 60 that extend away from the waveguide member 30 each take up only a small angle 67 (FIGS. 2 and 3) around a circumference of the waveguide member 30, less than 30° in an embodiment, for example about 20°. Any individual part 61, 62 can encompass less than 10° in an embodiment, or less than 5°, of the circumference of the waveguide member 30. The angle 67 is in this case measured around a center 45 FIG. 3) of the waveguide member 30, that means that the center of the waveguide member 30 is taken as the vertex of the angle 67. Further, the thickness 66 at the distance 180, 181 only makes up about 20% of the height 43 of the waveguide member 30. A description of the remaining features common to the previously described embodiments has been omitted herein for the purposes of brevity.

In the embodiment shown in FIG. 7, the waveguide member 30 has a circular cross-section. Again, in a cross-section, any part 61, 62 of the support structure 60 (FIG. 1 and FIG. 6) extending away from the waveguide member 30 makes up less than 10 degrees, and less than 5 degrees in an embodiment. A description of the remaining features common to the previously described embodiments has been omitted herein for the purposes of brevity.

Figure 8:
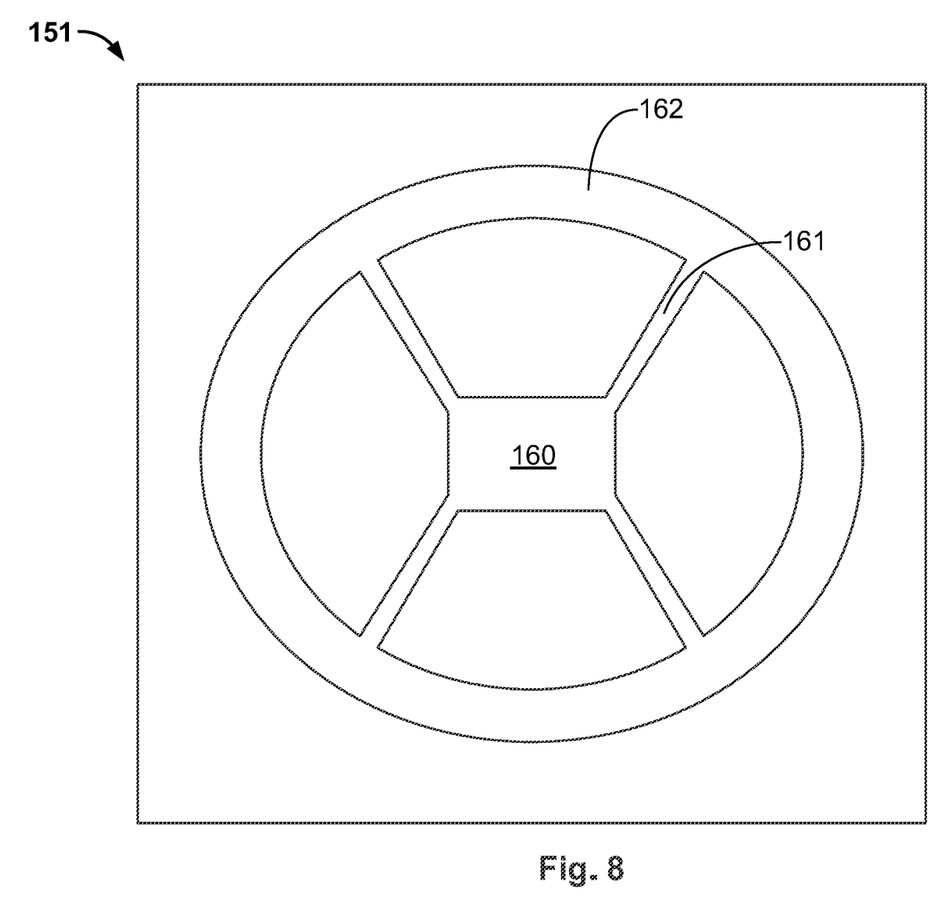
FIG. 8 is a schematic sectional view of a waveguide according to an embodiment.
Figure 9:
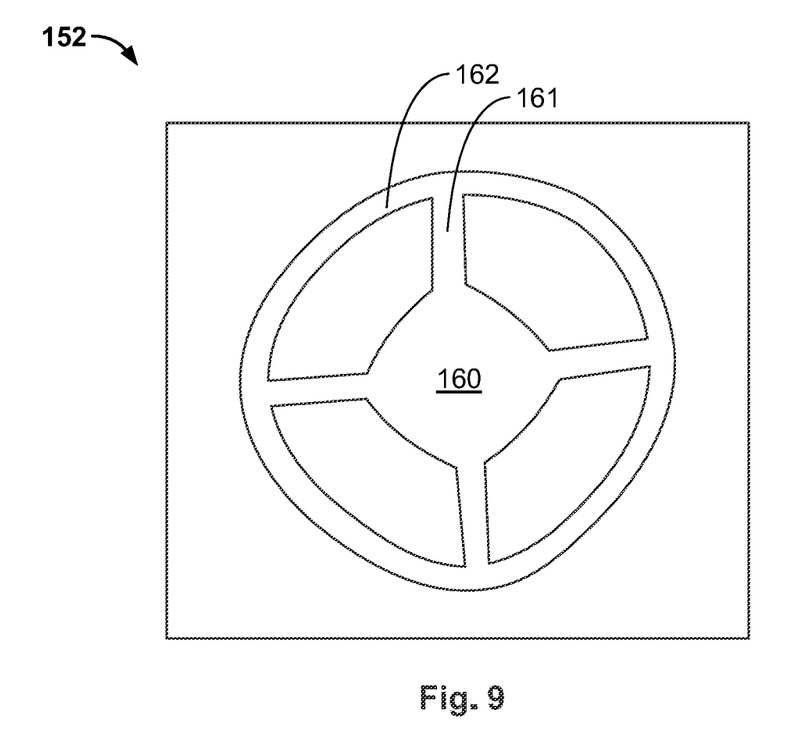
FIG. 9 is a schematic sectional view of a waveguide according to another embodiment.
Figure 10:
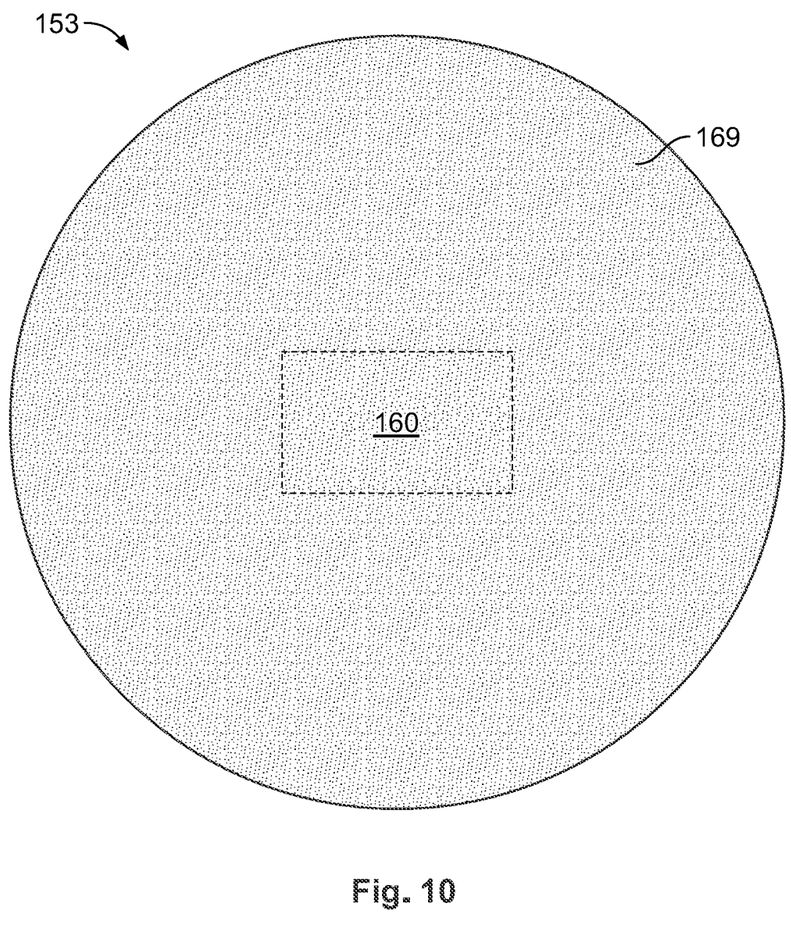
FIG. 10 is a schematic sectional view of a waveguide according to another embodiment.

In FIGS. 8-10, several embodiments of an external element 150 that can be attached to the redirecting device 100 are shown. In FIG. 8, a first embodiment 151 is shown, which comprises a core 160 with a rectangular cross-section that is held in the center of a supporting ring 162 by support members 161. The second embodiment 152 shown in FIG. 9 comprises a core 160 with a square shaped cross-section, which is also held within a support ring 162 by support members 161. In FIG. 10, a third embodiment 153 is shown in which a core 160 is located in a foam 169. The foam 169 has a low permittivity such that the waves are restrained within the core 160.

What is claimed is:

1. A redirecting device for mm-waves, comprising:
   an input section;
   an output section disposed at 90 degrees to the input section; and
   a waveguide member extending from the input section to the output section, the waveguide member is a rigid dielectric material, the redirecting device is a single monolithic piece, the waveguide member comprising a support structure supporting the waveguide member, a part of the support structure expands in width as the support structure extends away from the waveguide member.

2. The redirecting device of claim 1, wherein the waveguide member is an elongated element.

3. The redirecting device of claim 1, wherein the waveguide member has a constant cross-section.

4. The redirecting device of claim 1, wherein a minimum curvature radius of the waveguide member is greater than one wavelength.

5. The redirecting device of claim 1, wherein the support structure is arranged at an inner side of a curve of the waveguide member.

6. The redirecting device of claim 1, wherein the support structure extends along the waveguide member from the input section to the output section.

7. The redirecting device of claim 6, wherein the input section defines a first mounting plane and the output section defines a second mounting plane.

8. The redirecting device of claim 7, wherein the support structure extends from the waveguide member to the first mounting plane and/or to the second mounting plane.

9. The redirecting device of claim 1, wherein the support structure encloses an air cladding.

10. The redirecting device of claim 1, wherein, apart from the input section, the output section, and the support structure, no further material is present next to the waveguide member.

11. The redirecting device of claim 1, wherein a thickness of a part of the support structure extending away from the waveguide member is less than 20% of a maximum thickness of the waveguide member.

12. The redirecting device of claim 1, wherein, in a cross-section, any part of the support structure extending away from the waveguide member encompasses less than 10 degrees of a circumference of the waveguide member.

13. A redirecting device for mm-waves, comprising:
   an input section;
   an output section disposed at 90 degrees to the input section;
   a waveguide member extending from the input section to the output section, the waveguide member is a rigid dielectric material; and
   a support structure supporting the waveguide member, in a cross-section, any part of the support structure extending away from the waveguide member encompasses less than 10 degrees of a circumference of the waveguide member.

14. A redirecting device for mm-waves, comprising:

an input section;

an output section disposed at 90 degrees to the input section;

a waveguide member extending from the input section to the output section, the waveguide member is a rigid dielectric material; and a support structure supporting the waveguide member, a thickness of a part of the support structure extending away from the waveguide member is less than 20% of a maximum thickness of the waveguide member.

15. A redirecting device for mm-waves, comprising:

an input section;

an output section disposed at 90 degrees to the input section;

a waveguide member extending from the input section to the output section, the waveguide member is a rigid dielectric material; and a support structure supporting the waveguide member, apart from the input section, the output section, and the support structure, no further material is present next to the waveguide member.

16. A connection assembly, comprising:

a redirecting device including an input section, an output section disposed at 90 degrees to the input section, and a waveguide member extending from the input section to the output section, the waveguide member is a rigid dielectric material; and a housing element spaced from the waveguide member, the housing element is spaced by a distance of at least 1.0 times a wavelength away from the waveguide member.

17. A redirecting device for mm-waves, comprising:

an input section;

an output section disposed at 90 degrees to the input section; and a waveguide member extending from the input section to the output section, the waveguide member is a rigid dielectric material, a minimum curvature radius of the waveguide member is greater than one wavelength.

* * * * *